United States Patent [19]

Higeta et al.

[11] Patent Number: 5,428,312
[45] Date of Patent: Jun. 27, 1995

[54] ECL INTERFACE CIRCUIT

[75] Inventors: Keiichi Higeta; Satoru Isomura, both of Ohme; Kazuhiro Akimoto, Akishima, all of Japan

[73] Assignee: Hitachi, Ltd., Tokyo, Japan

[21] Appl. No.: 57,827

[22] Filed: May 7, 1993

[30] Foreign Application Priority Data

May 15, 1992 [JP] Japan .................. 4-148377

[51] Int. Cl.$^6$ .......................... H03K 19/086
[52] U.S. Cl. .......................... 327/333; 327/77; 327/112; 327/563; 326/77
[58] Field of Search ............ 307/296.6, 494, 362, 307/530, 246, 350; 327/77, 65, 52, 112, 333, 563; 326/75, 77

[56] References Cited

U.S. PATENT DOCUMENTS

| | | | |
|---|---|---|---|
| 4,516,041 | 5/1985 | Quan | 307/494 |
| 4,626,771 | 2/1986 | Williams | 307/296.6 |
| 4,736,125 | 4/1988 | Yuen | 307/296.6 |
| 4,751,404 | 6/1988 | Yuen | 307/296.6 |
| 4,806,800 | 2/1989 | Khan | 307/494 |
| 4,991,141 | 2/1991 | Tran | 307/530 |
| 5,068,552 | 11/1991 | Itou et al. | 307/494 |

Primary Examiner—Timothy P. Callahan
Assistant Examiner—My-Trang Nu Ton
Attorney, Agent, or Firm—Antonelli, Terry, Stout & Kraus

[57] ABSTRACT

A semiconductor integrated circuit device has a circuit construction which is devised with an output circuit for feeding an output current to an operating supply voltage in response to an output signal of a current switch circuit responding to an input signal. A constant current element for producing the operating current of the current switch circuit is fed with a constant voltage through a resistance element. A capacitor is coupled between the input of the constant current element and the operating supply voltage so that it constructs a time constant circuit together with the resistance element. The time constant circuit has a time constant set longer than the period of the output signal of the output circuit.

24 Claims, 9 Drawing Sheets

5,428,312

ECL INTERFACE CIRCUIT

BACKGROUND OF THE INVENTION

The present invention relates to a semiconductor integrated circuit device and, more particularly, to a technology which is effective for application to a static RAM (i.e., Random Access Memory) of the so-called "ECL interface bipolar-CMOS (i.e., Complementary MOS) construction" having an interchangeability with an ECL (i.e., Emitter Coupled Logic) circuit.

There is known a static RAM having the bipolar CMOS construction, in which memory cells are constructed of the CMOS circuit and which is structured so as to raise the degree of integration, reduce the power consumption and to use an ECL circuit in an input/output circuit. The static RAM of the bipolar CMOS construction is exemplified and discussed on pp. 38 to 39 and 284 of ISSCC DIGEST OF TECHNICAL PAPERS, 1989. Moreover, counter-measure schemes for overcoming the switching noise in the ECL circuit are disclosed in JP-A-60-90428 and JP-A-56-36231.

SUMMARY OF THE INVENTION

In the ECL circuit, a current switch circuit is connected with an operating supply voltage VEE through a constant current source so that the switching noise is not theoretically superposed on the supply voltage VEE. As a result, the counter-measures for the switching noise in the conventional ECL circuit are exclusively directed to the reference voltage or the circuit earth potential (GND) as in the above-specified patent applications.

In order to speed up the static RAM of the bipolar CMOS construction, we have conceived a scheme of providing an active pull-down circuit in the output of the ECL circuit thereby to provide an output signal having a high drive current and a large output amplitude. In case such output circuit is used, a current responding to the change in the output signal flows into the supply voltage VEE, also. The bonding wires for connections with the internal lines to be formed in the semiconductor integrated circuit or the external leads contain parasitic distribution resistances and inductance components. As a result, if the switching current flows to the supply voltage line, as described above, the potential between the emitter of the constant current transistor and the supply voltage VEE will accordingly change. The constant voltage to be fed to the base of the constant current transistor is produced by the constant voltage generator which is disposed apart from the aforementioned current switch circuit or the output circuit. Thus, the current corresponding to the noise having occurred in the aforementioned supply lines will flow into the constant current transistor. We have found that, if the output portion of the aforementioned ECL circuit is equipped with an active pull-down circuit or the like, the switching current flowing therethrough will cause a serious drop of the level margin of the ECL signal having a small amplitude.

An object of the present invention is to provide a semiconductor integrated circuit device which can realize a high speed and a stable operation.

Another object of the present invention is to provide a semiconductor integrated circuit device which includes a static RAM (i.e., Random Access Memory) of the bipolar CMOS construction and which can realize the high speed and the stability.

The aforementioned and other objects and novel features of the present invention will become apparent from the following description to be made with reference to the accompanying drawings.

Representative aspects of the invention to be disclosed herein will be briefly summarized in the following. Specifically, there is included a circuit whiten uses an output circuit for feeding an output current to an operating supply voltage in response to the output signal of a current switch circuit responding to an input signal. A constant voltage is transmitted through a resistor element to a constant current element for feeding the operating current of the current switch circuit. A time constant circuit is constructed by connecting a capacitor between the input of the constant current element and the operating supply voltage and is set to have a time constant longer than the period of the output signal of the output circuit.

According to the above-specified means, a high drive current and a large signal amplitude can be achieved by using the output circuit for feeding its output current to the operating supply voltage. As to the noise component which would develop in the operating supply voltage by the current flowing to the output circuit, the supply noise or the like resulting from the output current can be absorbed by the time constant circuit at the input side of the constant current element, thereby to stabilize the constant voltage to be fed to the constant voltage element. Thus, it is possible to retain a level margin of a small amplitude which is formed by a current switch circuit.

DESCRIPTION OF THE PREFERRED EMBODIMENTS

Figure 1:
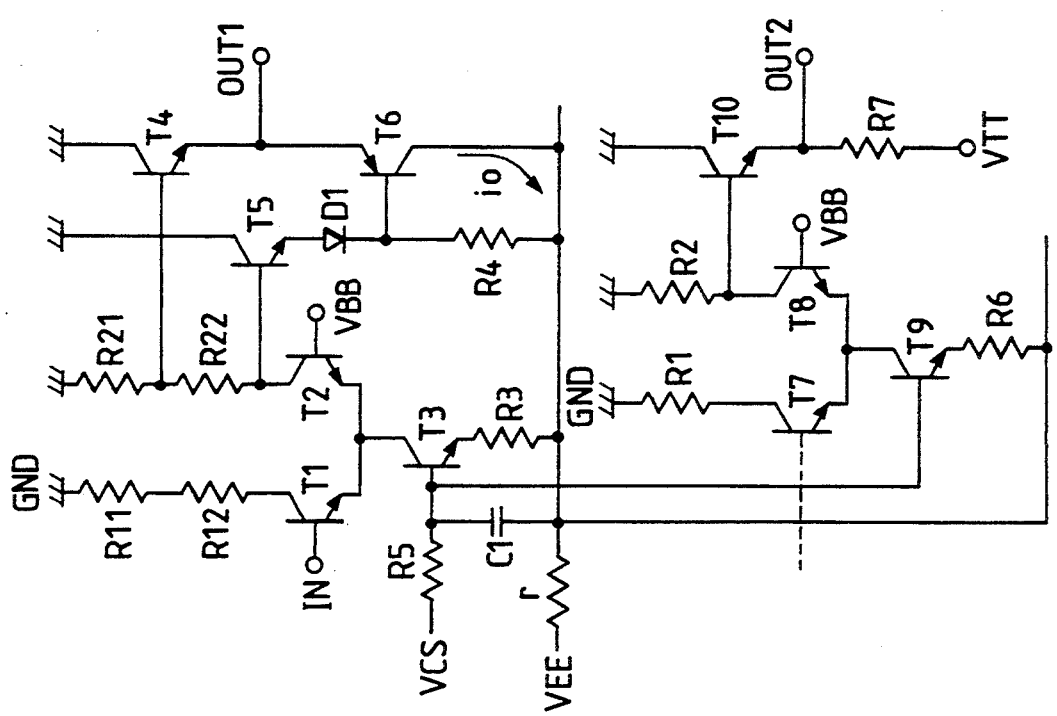
FIG. 1 is a circuit diagram showing one embodiment of an ECL circuit according to the present invention.

FIG. 1 is a circuit diagram showing one embodiment of the ECL (i.e., Emitter Coupled Logic) circuit according to the present invention. The circuit elements in FIG. 1 are formed over one semiconductor substrate of a single crystal of silicon by a well-known fabrication technology for a semiconductor integrated circuit device.

In order that the ECL circuit of this embodiment may drive a relatively high load at a high speed and with a relatively large signal amplitude, its load resistor to be connected between the collectors of differential transistors T1 and T2 and the wiring lines to be fed with an earth potential such as 0 V is constructed off a series resistance circuit including resistors R11 and R12, and R21 and R22. An output signal obtained from the node between the resistors R21 and R22 is fed to the base of an emitter-follower transistor T4. This transistor T4 has its emitter equipped with a PNP transistor T6 constructing an active pull-down circuit. This transistor T6 has its collector connected with a wiring line to be fed with a circuit supply voltage VEE having a negative value, for example. In order to operate the transistor T6 complementarily with the transistor T4 to establish a high drive current from an output terminal OUT1 with a low current consumption, there is provided the following circuit. Incidentally, the wiring lines to be fed with the earth potential are omitted from FIG. 1. This omission is made to prevail likewise in the remaining Figures.

The differential transistor T2 has its collector output fed to the base of an emitter-follower output transistor T5. This transistor T5 has its emitter output fed through a level shifting diode D1 to the base of the transistor T6. Between the diode D1 and the supply voltage VEE, there is connected a load resistor R4, although not especially limited thereto.

When an input signal IN to be fed to the base of one differential transistor T1 is at a higher level than a reference voltage VBB to be fed to the base of the other differential transistor T2, the differential transistor T1 is turned ON whereas the differential transistor T2 is turned OFF. As a result, a constant current is established by a constant current source, including a transistor T3 to be fed with a constant voltage VCS and an emitter resistor R3, which is fed to the transistor T1.

When the input signal IN is thus at the high level, the constant current does not flow through the differential transistor T2 so that a high level such as the earth potential of the circuit is fed to the bases of the emitter-Follower output transistors T4 and T5. As a result, what flows between the base and emitter of the transistor T6 is the bias voltage which is established by the level shift diode D1, so that the current outputted from the emitter of the transistor T4 is mostly consumed for driving a load connected with an output terminal OUT1. Thus, the output signal of the output terminal OUT1 can be raised at a high speed from low to high levels even if the load is relatively high.

If, on the other hand, the input signal IN to be fed to the base of one differential transistor T1 changes from the high level to a lower level than the reference voltage VBB to be fed to the base of the other differential transistor T2, the differential transistor T1 is turned OFF whereas the differential transistor T2 is turned ON. As a result, the constant current established by the constant current transistor T 3 is switched. In response to the ON state of the differential transistor T2, the current flows through the collector load resistors R21 and R22 so that the base potential of the emitter-follower output transistor T5 drops to a level lower than the base potential of the emitter-follower output transistor T4 by the voltage drop at the resistor R22. Since this potential difference is fed between the base and emitter of the PNP transistor T6, the current to flow through the base of the PNP transistor T6 increases in response to the aforementioned current switching action. In response to the increase in the base current, therefore, current to flow through the collector of the transistor T6 in response to the change from the high to low levels of the input signal IN so that the output signal of the output terminal OUT1 can be lowered at a high speed from the high to low levels even with a relatively high load.

With the provision of such an active pull-down circuit, a current which flows through the transistor T6, acting as a variable impedance load, will flow through the supply voltage line VEE. The aforementioned constant current transistor T3 has its emitter side potential changed by a parasitic resistance Γ in the supply voltage line VEE and a not-shown inductance component. On the other hand, a constant voltage circuit, which is arranged in a not-shown distant position through the aforementioned distribution resistance Γ and inductance component for establishing the constant voltage VCS in response to the active voltage VEE, establishes the substantially constant potential VCS which is not influenced by the noise due to the distribution resistance Γ and the inductance component. Between the base and emitter of the transistor T3, therefore, there is applied the noise component which is produced by the distribution resistance Γ, the inductance component and the output current io. As a result, the constant current transistor T3 acts as an amplify element with its emitter input, if its base is grounded to the earth, and the differential transistors T1 and T2 also act as a base-grounded and emitter-inputted amplifier so that relatively high noise is superposed on the ECL output signal.

In this embodiment, the constant current transistor T3 has its base fed with the constant voltage VCS through a resistor RS, and a capacitor C1 is connected between the base of the transistor T3 and the supply voltage VEE. The capacitor C1 and the resistor R5 construct together a time constant circuit to hold the base-emitter voltage of the constant current transistor T3 thereby to eliminate tile influence of the power source noise. As a result, the time constant of the capacitor C1 and the resistor R5 is set to a sufficiently high value with respect to the period of the output signal outputted from the aforementioned output terminal OUT. In case the ECL circuit is used in a digital circuit to be operated by a clock pulse, for example, the resistor RS and the capacitor C1 to be used are given a time constant sufficient for the period of the clutch pulse.

In the proximity of the aforementioned circuit for driving the relatively high load at a high speed and with a relatively large signal amplitude, there is provided an ordinary ECL circuit which includes transistors T7 to T10 and resistors R1 and R2, and R6 and R7. In this ECL circuit, too, a high noise is superposed on an output terminal OUT2 under the influence of the aforementioned output current io. Let the case be considered, in which the aforementioned ordinary ECL circuit is coupled as a next stage circuit to the output terminal OUT2. If a noise is superposed by the aforementioned reason upon a low-level output signal to be outputted from the outer terminal OUT2 so that the high level of the output signal having the superposed noise is dropped to a lower level than the reference voltage VBB of the next stage circuit (i.e., the ordinary ECL circuit), this next stage circuit decides the signal of the output terminal OUT2 to be at the high level, although it should be intrinsically decided to be at the low level, so that a malfunction occurs in the entire semiconductor integrated circuit.

In this ECL circuit, therefore, the aforementioned time constant circuit is commonly used to feed the constant voltage VCS to the constant current transistor T9. This common use makes it possible to provide only one time constant circuit for one functional block or a circuit unit so that the circuit can be stabilized while driving the aforementioned high load at a high speed but without any substantial increase in the number of circuit elements. Incidentally, it goes without saying that the aforementioned ordinary ECL circuit should not be limited to one for sending an output signal to the outside of the semiconductor integrated circuit device through the output terminal OUT2 but may be exemplified by one for producing the input signal IN to drive a relatively high load, as shown in FIG. 1, at a high speed and with a relatively large signal amplitude.

Figure 2:
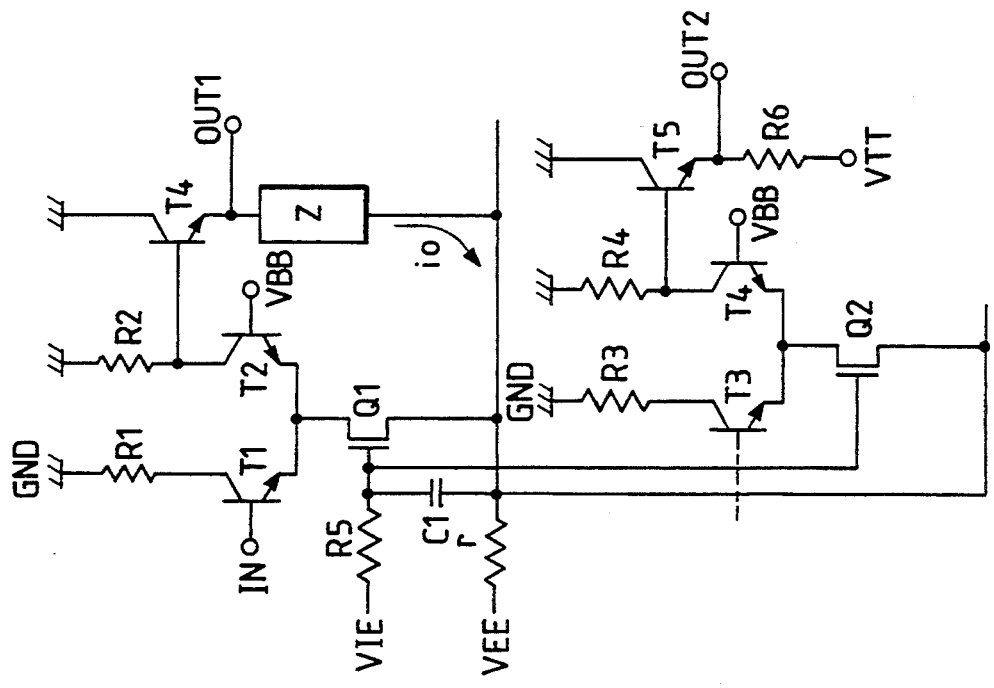
FIG. 2 is a circuit diagram showing another embodiment of the ECL circuit according to the present invention.

FIG. 2 is a circuit diagram showing another embodiment of the ECL circuit of the present invention. The circuit elements of FIG. 2 are formed over one semiconductor substrate of a single crystal of silicon by the well-known fabrication technology of a bipolar CMOS semiconductor integrated circuit.

The ECL circuit of this embodiment uses an MOSFET Q1 as the constant current source. This MOSFET Q1 acts as the constant current source when its gate is fed with a constant voltage VIE which is generated by a later-described bias circuit. On the other hand, the emitter-follower output circuit is equipped with a variable impedance Z as a load. This variable impedance load is an active pull-down circuit which is changed, as described above, to have a high impedance, if the output signal is at the high level, and a low impedance when the same is at a low level. The specific construction is made either to have the aforementioned one shown in FIG. 1 or on the basis of a similar technological concept.

Like before, in order to eliminate the influence of the noise which is caused in the supply voltage VEE by the current io flowing through the aforementioned variable impedance Z, the MOSFET Q1 acting as the constant current source has its gate fed with the constant voltage VIE through the resistor R5. Moreover, the capacitor C1 is connected between the gate and source (at VEE) of the MOSFET Q1. In case the constant current source is exemplified by the MC. SFET as in this embodiment, its input impedance is infinite in the DC characteristics so that the resistor R5 can be given a high resistance. Moreover, since the MOSFET Q1 itself has a gate capacitance, a sufficiently large time constant can be achieved by employing the capacitor C1 having a small capacitance. For this reason, the constant current source of the ECL is desirably constructed of the MOSFET in case the semiconductor integrated circuit device is constructed by the bipolar CMOS technology.

In the proximity of the aforementioned circuit for driving the relatively high load at a high speed and with a relatively large signal amplitude, there is provided an ordinary ECL circuit which is constructed to include the transistors T3 to T5, a MOSFET Q2 and the resistors R3 to R6. In this ECL circuit, too, a high noise is superposed on the output terminal OUT2 under the influence of the output current io to flow the aforementioned variable impedance circuit Z into the supply line VEE. Therefore, let the case be considered, in which the ordinary ECL circuit is coupled as a next stage circuit to the output terminal OUT2. If a noise is superposed by the aforementioned reason upon a low-level output signal to be outputted from the outer terminal OUT2 so that the high level of the output signal having the superposed noise is dropped to a lower level than the reference voltage VBB of the next stage circuit (i.e., the ordinary ECL circuit), this next stage circuit decides the signal of the output terminal OUT2 to be at the high level, although it should be intrinsically decided to be at the low level, so that a malfunction occurs in the entire semiconductor integrated circuit.

Therefore, in this ECL circuit, too, the aforementioned time constant circuit is commonly used to feed the constant voltage VIE to the constant current MOSFET Q2. This common use makes it possible like before to provide only one time constant circuit for one functional block or a circuit unit, to set the resistance of the resistor R5 to a sufficiently high level and to exploit the gate capacitance of the MOSFET Q2 so that the substantial area to be occupied by the time constant circuit can be reduced. Incidentally, it goes without saying that the aforementioned ordinary ECL circuit should not be limited to one for sending an output signal to the outside of the semiconductor integrated circuit device through the output terminal OUT2 but may be exemplified by one for producing the input signal IN to drive a relatively high load, as shown in FIG. 1, at a high speed and with a relatively large signal amplitude.

Figure 3:
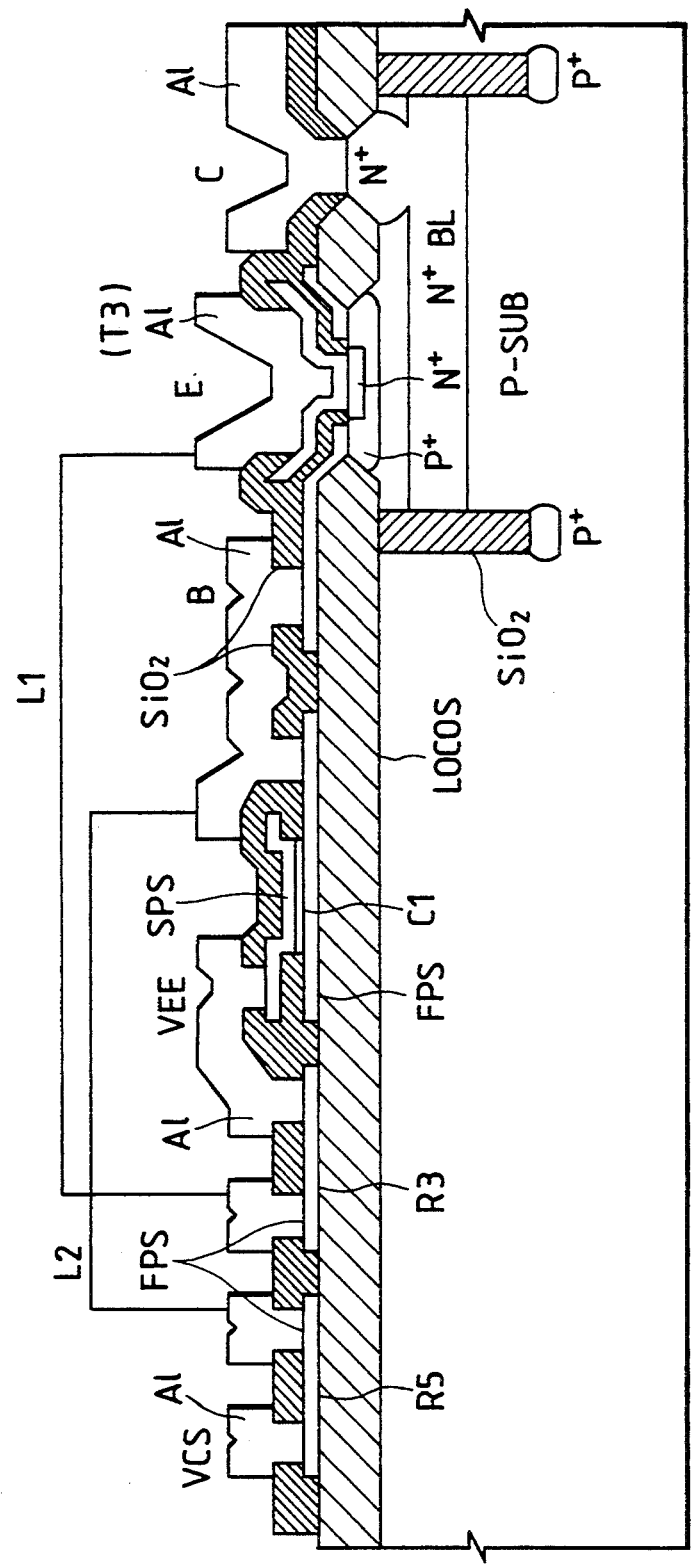
FIG. 3 is a section of an element structure showing one embodiment of a transistor T3 and an emitter resistor R3 constructing a constant current source and a resistor R5 and a capacitor C1 constructing a time constant circuit in the embodiment circuit of FIG. 1.

FIG. 3 is a section of an element structure of one embodiment the transistor T3 and the emitter resistor R3 constructing the constant current source and the resistor R5 and the capacitor C1 constructing the time constant circuit in the aforementioned embodiment circuit of FIG. 1.

The transistor T3 is formed in the region which is separated by a silicon oxide film $SiO_2$. Below this silicon oxide film $SiO_2$, there is formed a P layer. The N-type semiconductor regions $N^+$ BL and $N^+$ forming the collector C of the transistor T3 are connected with the collector output wiring through a wiring of aluminum A1 or the like. The $P^+$ layer forming the base B of the transistor T3 is led out by a first poly-silicon layer FPS and is connected with the aluminum wiring B through a contact hole formed in the inter-layer insulating film $SiO_2$. The wiring is extended as it is over the inter-layer insulating film and connected with one electrode of the capacitor C1 which is constructed of the first poly-silicon layer FPS formed over a field insulating film LOCOS. A thin insulating film is formed between the first poly-silicon layer FPS and a second poly-silicon layer SPS and is used as a dielectric material to construct the capacitor C1 having a small occupation area but a relatively high capacity. The second poly-silicon layer SPS constructing the other electrode of the capacitor C1 is fed with the supply voltage VEE through the wiring made of aluminum or the like.

The wiring to be fed with the supply voltage VEE is connected with one end of the resistor R8 which is formed of the first poly-silicon layer FPS. The other end of the resistor R8 is connected with the aluminum layer which is connected with the emitter E of the transistor T8 through a solid line L1 only indicating the connection relation in FIG. 8. The aluminum layer connected with the emitter E is connected with the N+ layer through the second poly-silicon layer SPS. Between the first and second poly-silicon layers, there is formed a $SiO_2$ film acting as an inter-layer insulating film. Moreover, the first poly-silicon layer FPS forms the resistor R5 constructing the time constant circuit. This resistor R5 has its one end fed with the constant voltage VCS and its other end connected with the base B of the transistor T8 through a solid line L2 only indicating the connection relation in FIG. 8. The aforementioned solid lines L1 and L2 are formed of an aluminum layer, although not especially limited thereto. The aforementioned aluminum layers acting as wiring means may be replaced by other metal wiring means such as tungsten layers.

Figure 4:
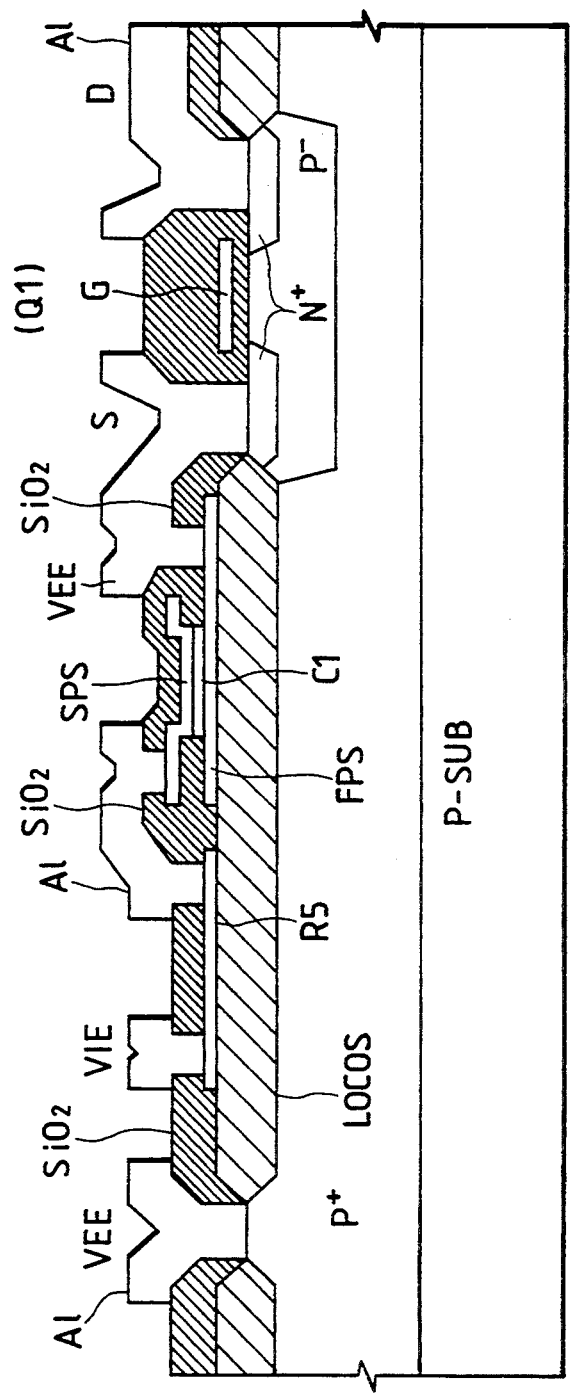
FIG. 4 is a section of an element structure showing one embodiment of a MOSFET Q1 constructing a constant current source and a resistor R5 and a capacitor C1 constructing a time constant circuit in the embodiment circuit of FIG. 2.

FIG. 4 is a section of an element structure showing one embodiment of the MOSFET Q1 constructing the constant current source and the resistor R5 and the capacitor C1 constructing the time constant circuit in the aforementioned embodiment circuit of FIG. 2.

The $P^-$-type substrate (P−SUB) is formed thereover with a $P^+$ layer. Of this $P^+$ layer, the portion to be formed with the MOSFET Q1 is formed with a $P^-$-type well region, which in turn is formed with an N - type diffusion layer constructing the source and the drain. On the surface of the well region sandwiched between those source and drain, there is formed through a thin gate oxide film a gate electrode. This gate electrode is constructed of the first poly-silicon layer, although not especially limited thereto.

The capacitor C1 and the resistor R5 are formed like the aforementioned embodiment of FIG. 3 over the field insulating film LOCOS. Specifically, the wiring line connected with the source S and made of the aluminum layer is extended as it is over the inter-layer insulating film and is connected with one electrode of the capacitor C1 constructed of the first poly-silicon layer FPS. A thin insulating film is formed between the first poly-silicon layer FPS and the second poly-silicon layer SPS and is used as a dielectric material to construct the capacitor C1. As a result, it is possible to form the capacitor C1 having a relatively large capacity despite of a small occupation area.

The second poly-silicon layer SPS constructing the other electrode of the capacitor C1 is connected through the aluminum wiring line with one end of the resistor R5 made of the second poly-silicon layer SPS. The other end of the resistor R5 is fed with the constant voltage VIE through the aluminum wiring line. Incidentally, the portion formed with the field insulating film LOCOS is fed with the supply voltage VEE by the aluminum wiring line. This voltage VEE is fed as a bias through the aforementioned $P^+$ layer to the well region. The aluminum wiring line connecting the resistor R5 and the capacitor C1 is extended as it is and connected with the gate G1 of the MOSFET Q1. FIG. 4 shows the connection with the aforementioned gate electrode only and omits the solid lines indicating the connection relations in FIG. 3. The aluminum layers acting as the wiring means may be replaced by other metal wiring means such as tungsten layers.

FIGS. 5 to 9 are circuit diagrams showing embodiments of the static RAM having the bipolar CMOS construction to which is applied the present invention. In these individual circuits, the circuit symbols attached to the individual circuit elements are partially overlapped but should be understood to realize individual circuit functions different from one another. This is similar to the aforementioned circuit diagrams of FIGS. 1 and 2.

Figure 5:
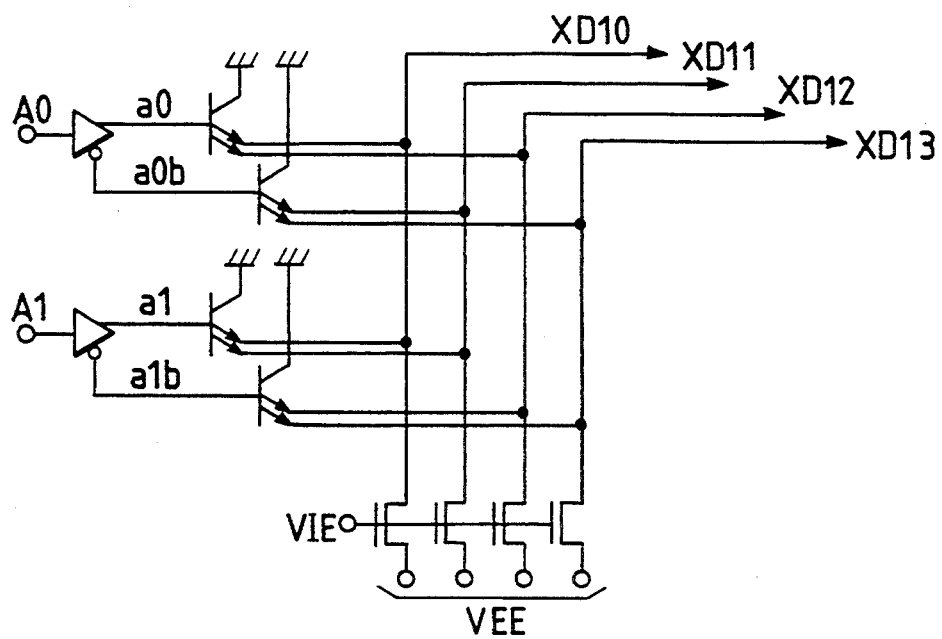
FIG. 5 is a circuit diagram showing one embodiment of an address buffer and a predecoder in a static RAM, to which is applied the present invention.

FIG. 5 shows one embodiment of an input buffer and a predecoder in the aforementioned static RAM. This embodiment is equipped with input buffers corresponding to address signals A0 and A1 of 2 bits and a predecoder for shifting the levels of the complementary output signals received from the input buffers and for producing four pre-decode signals XD10 to XD13. The input buffers are constructed of ECL circuits corresponding to the address signals A0 and A1 at the ECL level. In response to the address signals A0 and A1 at the ECL level, the input buffers produce internal address signals a0 and a1 in phase with the address signals A0 and A1 and internal address signals a0b and a1b in the opposite phase.

Those complementary address signals a0 and a0b, and a1 and a1b are inputted to the bases of the emitter-follower transistors for shifting the levels and taking the wired logics. FIG. 5 is shows to use the multi-emitter transistors, which can be replaced by two transistors having their bases and collectors connected commonly.

The individual one emitters of the transistors for receiving the internal address signals a0 and a1 are made common to form an N-channel MOSFET constructing a constant current load. As a result, the predecode signal XD10 is produced by the wired OR logic which takes the low level when both the two signals a0 and a1 are at the low level. The individual one emitters of the transistors for receiving the internal address signals a0b and a1 are made common to form an N-channel MOSFET constructing a constant current source similar to the aforementioned one. The aforementioned constant current load MOSFET acts as a constant current source if fed with the constant voltage VIE. As a result, the pre-decode signal XD11 is produced by the wired OR logic which takes the low level when both the two signals a0b and a1 are at the low level.

Likewise, the pre-decode signals XD12 and XD13 are produced by the remaining combinations of the address signals a0 and a1b, and a0b and a1b. These pre-decode signals XD10, XD11, Xd12 and Xd13 are used as input signals XD1 and XD2 of a later-described level converter shown in FIG. 8. The address buffers and predecoders of this embodiment are connected as in the conventional ECL circuit with the supply voltage VEE only through the constant power sources so that they will not produce the noise resulting from the current switching.

If the pre-decoder circuit is adjoined by a circuit for feeding a switching current to the supply voltage line VEE of the pre-decoder circuit, a noise component may be superposed upon the supply voltage VEE to be fed to the source of the constant current MOSFET by the circuit operating current. This superposition may be eliminated by feeding the constant voltage VIE to the gate of a constant current MOSFET similar to the aforementioned one and by connecting a capacitor between the gate and the source to provide a time constant circuit corresponding to the aforementioned resistor R5 and capacitor C1.

Figure 6:
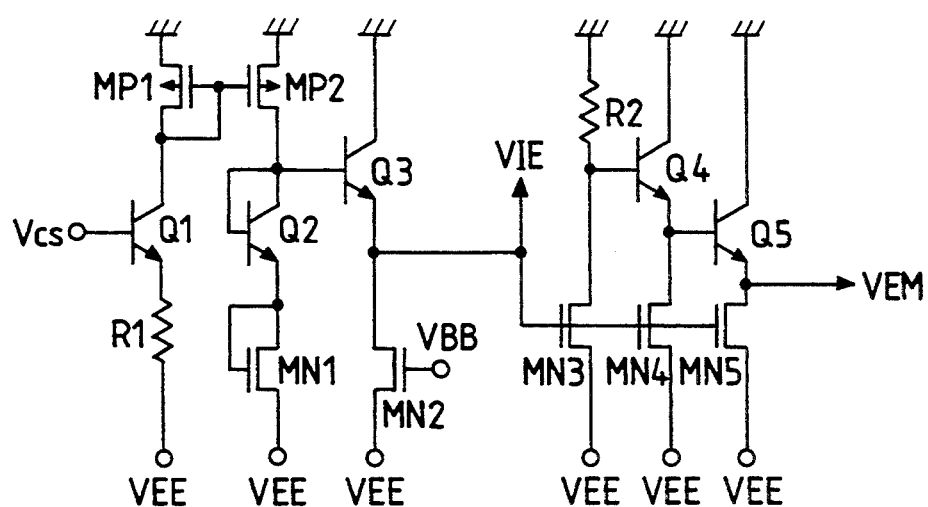
FIG. 6 is a circuit diagram showing one embodiment of a voltage generator for generating constant voltages VIE and VEM in the static RAM, to which is applied the present invention.

FIG. 6 shows one embodiment of a voltage generator for generating the constant voltages VIE and VEM in the static RAM to which is applied the present invention. The constant voltage VIE is one to be fed to the gate of the aforementioned constant current; MOSFET, and the constant voltage VEM is an operating voltage of a memory array, i.e, a supply voltage for operating the CMOS circuit.

The resistor R1 is connected with the emitter of the transistor Q1 in the ECL circuit, which is made receptive of the constant voltage VCS, so that the constant may flow through the resistor R1. This constant current is caused by P-channel type MOSFETs MP1 and MP2 of current mirror connection to flow through a series circuit which is composed of the transistor Q2 and N-channel type MOSFET MN1, both of which are of diode connection. The aforementioned diode connection transistor Q2 constructs a level shift circuit so that a constant voltage VTH corresponding to the threshold voltage of the MOSFET MN1 is outputted as the aforementioned constant voltage VIE through an emitter-follower output transistor Q3. A MOSFET MN2 made receptive of the constant voltage VBB is made to act as the load of the emitter-follower output transistor Q3.

Since, in this construction, the constant voltage VIE corresponds to the threshold voltage VTH of the aforementioned MOSFET MN1, N-channel type MOSFETs MN3, MN4 and MN5 made receptive of the constant voltage VIE produce a constant current according to the constant current which is produced by the aforementioned resistor R1. For example, the P-channel type MOSFETs MP1 and MP2 are equally sized, and the same constant current produced by the resistor R1 is fed to the N-channel type MOSFET MN1. If those MOSFETs MN1 and MN3 to MN5 are then equally sized, the same constant current as that of the MOSFET MN1, i.e., the constant current to flow through the resistor R1 is made to flow through those MOSFETs MN3 to MN5.

The size of the MOSFET MN3 of FIG. 6 is equalized to the size of the N-channel type MOSFET Q1 for producing the constant current of the aforementioned current switching of FIG. 2 so that the same constant current may flow, and the resistance of the resistor R2 is set to the same value of a collector load resistor RC1 or the like of the current switch circuit in a later-described level converter shown in FIG. 8. Thus, by equalizing the level of the output signal to the low level of the output signal in the current switch circuit (i.e., the ECL circuit) to output it through emitter-follower output transistors Q4 and Q5 of Darlington connection, it is made possible to produce the constant voltage VEM which is set to the low level of the output signal of the lever converter shown in FIG. 8. Here, the MOSFETs MN4 and MN5 construct the loads of the aforementioned emitter-follower output transistors Q4 and Q5 to equalize the output signal to the constant current Ief in the level converter of FIG. 8. In this construction, even with the process dispersion, the low level of the output signal of the level converter and the low-level operating voltage VEM of the CMOS circuit made receptive of the level-converted output can change in association with each other to eliminate the influences of the process dispersion substantially.

Figure 7:
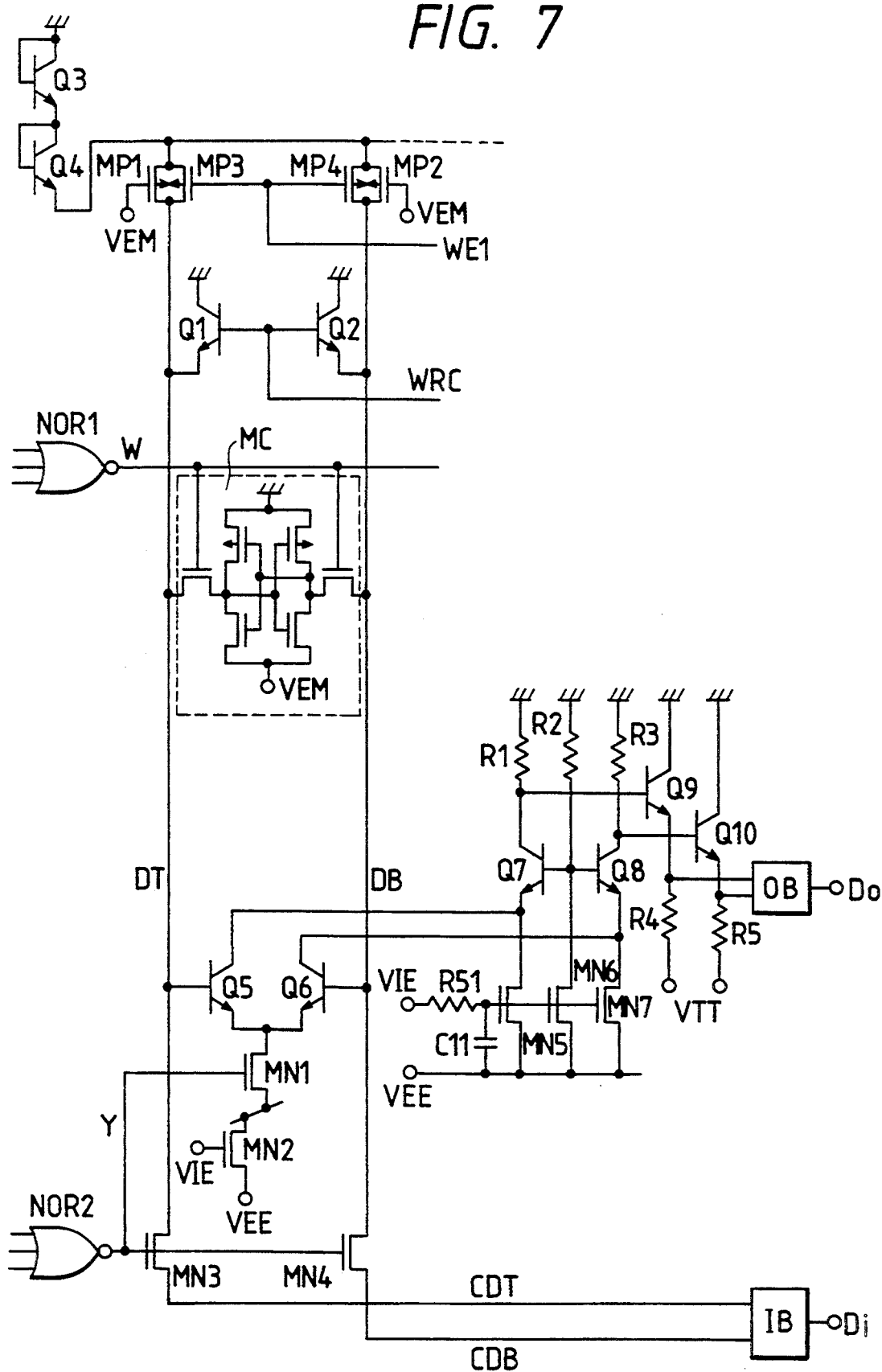
FIG. 7 is a circuit diagram showing one embodiment of a memory array unit and its peripheral circuit in the static RAM, to which is applied the present invention.

FIG. 7 is a circuit diagram showing one embodiment of a memory array unit and its peripheral circuit in the static RAM to which is applied the present invention. In FIG. 7, there are shown by way of example one word line W, one word line selector, one memory cell MC, a pair of complementary data lines DT and DB, and their load circuit, write recovery circuit, sense amplifier and column switch circuit. There are further shown an output circuit corresponding to the sense amplifier, and a data input circuit IB.

The memory cell MC is constructed to include a CMOS latch circuit, with which are crossly connected the input and output of a CMOS inverter composed of a P-channel type MOSFET and an N-channel type MOSFET, and address selecting transmission gate MOSFETs which are connected between the input-/output nodes of the CMOS latch circuit and the complementary data lines DT and DB. The high-level operating voltage of the memory cells employs the earth potential of the circuit, and the low-level operating voltage employs the constant voltage VEM which is produced by the aforementioned voltage generator of FIG. 6.

The memory cells of this embodiment employ those of complete CMOS construction, but the P-channel type MOSFETs may be replaced by high resistive loads formed of the poly-silicon layer or the like. These highly resistive loads are given the high resistances to feed such a minute current that the stored level in the gates of the N-channel type MOSFETs may not be lost by the drain leakage current. Therefore, the highly resistive loads have a quite different meaning from those in the ordinary ratio type inverter. In case such highly resistive loads are used, it is possible to reduce the size (or occupied area) of the memory cells. If, however, the low-level operating voltage of the memory cells is set to a level as low as $-3.2$ V to $-3.3$ V, the memory cells may have unstable operations. Therefore, it is preferable to use the completely CMOS type memory cells.

The transmission gate MOSFETs of the memory cells are connected with the corresponding word lines. Each of these word lines W is driven by a word line selector NOR1 which is constructed of a level converter having a logical function, as will be described hereinafter. A select signal of one word line is produced by inputting the aforementioned pre-decode signal shown in FIG. 5, to the input transistor of the current switch circuit in the aforementioned level converter. For example, the three-input NOR gate NOR1 has its one input fed with one output signal of the aforementioned pre-decoder shown in FIG. 5, its another input fed with a similar pre-decode output signal corresponding to address signals A2 and A3, and its remaining one input fed with a similar pre-decode output signal composed of address signals A4 to A6. Then, it is possible to realize such a circuit construction as to select one from one hundred and twenty eight word lines, so that a word line selecting signal is produced from one word line selector in which all the aforementioned pre-decode signals are set to the low level.

The complementary data lines DT and DB are equipped with data line load means which are composed of the P-channel type MOSFETs MP1 and MP2. These MOSFETs MP1 and MP2 are formed to have their conductances reduced to relatively small values while considering the writing characteristics and to have their gates fed steadily with the constant voltage VEM. These MOSFETs MP1 and MP2 have their source and drain paths equipped in parallel with the source and drain paths of P-channel MOSFETs MP3 and MP4 having relatively high conductances. These MOSFETs MP3 and MP4 are turned ON, while in operations other than the writing operation, if their gates are fed with a write control signal WE1.

In other words, the aforementioned MOSFETs MP3 and MP4 construct together with the MOSFETs MP1 and MP2 the data line loads for the reading operation. In short, the MOSFETs MP3 and MP4 limit the signal amplitudes of the complementary data lines, when in the reading operation, to realize the high speed read. In the writing operation, on the other hand, the aforementioned MOSFETs MP3 and MP4 having the relatively high conductances are turned OFF in response to the control signal WE1 so that the loads for the complementary data lines DT and DB are constructed of the MOSFETs MP1 and MP2 having the small conductances. Thus, the signal amplitudes of the write data to be transmitted to the complementary data lines are enlarged to write the memory cells at a high speed.

The aforementioned load circuit is fed with the bias voltage which has its level shifted by the diode-connected transistors Q3 and Q4. In other words, the signal amplitudes of the complementary data lines DT and DB have their high levels set to a potential as low as $-2$ VBE. As a result, the signal amplitudes of the complementary data lines DT and DB are limited in the writing operation to a small value so that a high speed write can be achieved. Since the write of the memory cells is carried out dominantly by the low level transmitted to the complementary data line DT or DB, there arises no problem even if the high level is made as low as $-2$ VBE as in this embodiment. Specifically, the ON gate potential of the memory MOSFET of the memory cell is extracted by the potential of the complementary data line, which is dropped to the low level through the transmission gate MOSFET, and is switched OFF so that the other memory MOSFET is switched from OFF to ON states to effect the inverted write of the data.

The complementary data lines DT and DB are connected through the N-channel type MOSFETs MN3 and MN4 for the column switch with a pair of common (shared) complementary data lines CDT and CDB. These common complementary data lines CDT and COB are connected with the output terminals of the data input buffer IB for transmitting the write data. The aforementioned column switch MOSFETs MN3 and MN4 have their gates fed with a column select signal Y which is produced by a NOR gate NOR2 constructed of a level converter similar to the aforementioned one. This NOR gate is also fed with the pre-decode signal, which is produced by a pre-decoder similar to the aforementioned one, to produce the column select signal. In case, for example, the memory array is composed of $128 \times 128$ memory cells so that the memory cells are accessed at the unit of 16 bits, there are provided 128 word lines W, 128 pairs of complementary data lines DT and DB, and 16 pairs of common complementary data lines. In short, each pair of common complementary data lines CDT and CDB are provided for eight pairs of data lines DT and DB.

In the construction of that memory array, eight types of pre-decode signals for the column switches are produced from address signals A7 to A9 of 3 bits. In this case, the pre-decode signal is only one so that the level converter NOR2 has one input to omit the logical function of the aforementioned current switch circuit. The aforementioned column select signal Y produced by the level converter NOR2 is commonly fed to the gates of column switch MOSFETs for connecting the sixteen pairs of complementary data lines with the sixteen pairs of common complementary data lines.

The complementary data lines DT and DB are connected with the bases of the differential transistors Q5 and Q6 constructing a sense amplifier. In short, this memory is of the column sense type. The common emitters of those differential transistors Q5 and Q6 are connected with the constant current MOSFET MN2 through the switch MOSFET MN1 for receiving the column select switch Y. The constant current MOSFET MN2 has its gate fed with the aforementioned constant voltage VIE to produce a constant current. In case the memory access is to be carried out at the unit of 16 bits from the $128 \times 128$ memory cells, as described above, that constant current MOSFET MN2 is shared among the eight sense amplifier constant current MOSFETs corresponding to the eight column addresses.

The aforementioned differential transistors Q5 and Q6 have their collectors connected with a current/voltage converter. Specifically, the collectors of the transistors Q5 and Q6 are connected with the emitters of transistors Q7 and Q8 having their bases receptive of the bias voltage produced by the resistor R2, through which flows the constant current produced by the MOSFET receptive of the constant voltage VIE. The transistors Q7 and Q8 are equipped at their emitters with constant current MOSFETs MN5 and MN7 made receptive of the constant voltage VIE and the resistors R1 and R3 for the current/voltage conversions. The complementary data lines DT and DB output the high/low levels corresponding to the stored data of the memory cell selected. In response to the high/low level, the differential transistors Q5 and Q6 constructing the sense amplifier are turned ON/OFF.

In response to the ON/OFF states of the aforementioned differential transistors, the constant current flows through the aforementioned resistor R1 or R3 through the MOSFET MN1 which is turned ON by the column select signal Y. The voltage signal converted from the read signal by those resistors R1 and R3 is inputted to an output buffer OB through the emitter-follower circuit which is constructed of transistors Q9 and Q10 and the emitter resistors R4 and R5. The output buffer OB is constructed of the ECL circuit to output an output signal Do at the ECL level according to the aforementioned read signal converted into the voltage signal.

Sixteen current/voltage converters are provided in case the memory accesses are carried out at the unit of 16 bits. In these circuits, too, if the noise is superposed on the supply voltage line VEE, there is superposed on the output signal the noise which is amplified by the constant voltage MOSFETs MN5 and MN7 and the transistors Q7 and Q8. As a result, the constant voltage VIE is transmitted through a resistor R51 to the gates of the constant voltage MOSFETs MN5, MN6 and MN7 which are shown as those current/voltage converters, by way of example, and a capacitor C11 is connected between the gate and the source.

As in this embodiment, one current/voltage converter is equipped with three MOSFETs. Therefore, the sixteen current/voltage converters are enabled to have large gate capacities by connecting totally forty eight MOSFETs in parallel. Therefore, the aforementioned capacitor C11 may be those gate capacities.

The transistors Q1 and Q2 construct a write recovery circuit and is turned ON in response to a recovery signal WRC produced at the end of the writing operation, to reset the complementary data lines DT and DB having a relatively large level difference, quickly in response to the write signal transmitted thereto. The recover signal WRC is outputted through the emitter-follower output transistors. Therefore, the complementary data lines DT and DB are given a level equal to the bias level ($-2$ VBE) corresponding to the aforementioned bias circuit (of the transistors Q3 and Q4), because the transistors Q1 and Q2 are connected in the Darlington connection with the output transistors for producing the aforementioned recovery signal WRC.

Figure 8:
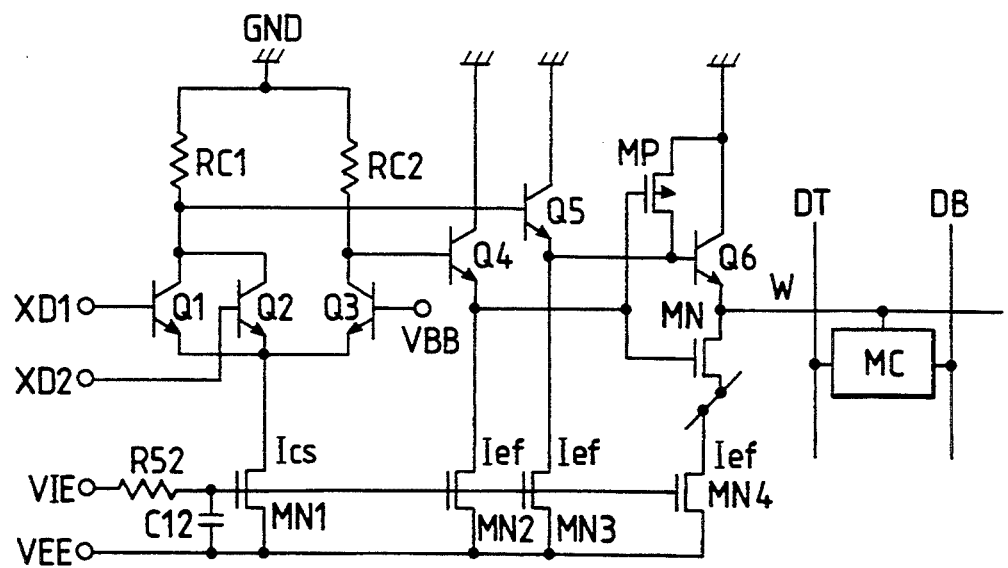
FIG. 8 is a circuit diagram showing one embodiment of a decoder and level converter in the static RAM, to which is applied the present invention.

FIG. 8 is a circuit diagram showing one embodiment of a decoder and a level converter in the static RAM to which is applied the present invention. The decoder produces one word line select signal in response to the pre-decode output signals XD1 and XD2. The level converter has a function as a word driver for level conversions and for producing a word line select signal.

Specifically, the input signals XD1 and XD2 are the pre-decode outputs, as will be described hereinafter, and are signals at the ECL level. These input signals are fed to the bases of the transistors Q1 and Q2 which are connected in parallel and given a logic function. Differentially with respect to the parallel transistors Q1 and Q2, there is connected the transistor Q3. This transistor Q8 has its base fed with the reference voltage VBB corresponding to the input level.

The collectors of the parallel transistors Q1 and Q2 and the collector of the transistor Q3 are respectively equipped with the load resistors RC1 and RC2. Moreover, the transistors Q1 and Q3 of the aforementioned differential connection are equipped with the MOSFET MN1 for producing a constant current Ics. The differential circuit of this embodiment is given a circuit construction similar to that of the ECL circuit, in which the output signals (Ics×RC1) or (Ics×RC2) to be produced by the constant current Ics and the resistors RC1 and RC2 is made higher than the ordinary ECL level. Specifically, the output signal is set to such a relatively high level for selecting/unselecting the word lines in the memory array constructed of the later-described CMOS circuit or for having a level corresponding to the input signal in the CMOS circuit.

The complementary output signals, i.e., the inverted output signal ob and the noninverted output signal or, which are produced by the resistors RC1 and RC2 of the current switch circuit including the aforementioned differential transistors Q1 to Q3, are respectively fed to the bases of the emitter-follower transistors Q5 and Q6. These emitter-follower transistors Q5 and Q4 have their emitters equipped respectively with the MOSFETs MN2 and MN3 acting as loads for a constant current Ief. The emitter-follower output signal corresponding to the inverted output signal ob of the aforementioned current switch circuit is fed to the base of the output transistor Q6.

The emitter-follower output signal of the noninverted output ot of the aforementioned switch circuit is fed to the gate of an active pull-down of N-channel type MOSFET MN which is connected with the emitter of the aforementioned output transistor Q6. The active pull-down N-channel type MOSFET MN is equipped at its source with the MOSFET MN4 for feeding the constant current Ief to the word line selecting circuit of similar construction having the level conversion and the logic function. In order to compensate the high level of the output signal, although not especially limitative, there is connected between the base and collector of the output transistor Q6 an active pull-up P-channel type MOSFET MP which is fed with the emitter-follower output signal corresponding to the aforementioned noninverted output or. This MOS, FET MP is given a threshold voltage (Vth) as low as $-0.5$ V.

The aforementioned emitter-follower output transistor Q6 has its emitter connected with the word line W. In FIG. 8, there is shown as a representative one memory cell MC, as has been described hereinbefore, and the word line is connected with the address select terminal of the memory cell. The memory cell MC has its input/output nodes connected with a pair of complementary data lines which are composed of the noninverting data line DT and the inverting data line DB. The circuit has its high-level supply voltage set to the earth potential such as 0 V in a manner to correspond to the ECL circuit and its low-level supply voltage VEE is set to a relatively low negative voltage such as about $-4$ V so as to reduce the power consumption, although not especially limited thereto. Alternatively, the supply voltage VEE may be a negative voltage such as $-5.2$ V as in the conventional ECL circuit.

The output signal having its level converted by the level converter of this embodiment has its low level VL determined by the following equation (1):

$$VL = -[Ics \times RC1 + VBE(Q5) + VBE(Q6)] \qquad (1)$$

Here, the voltages VBE(QS) and VBE(Q6) are the base-emitter voltages of the aforementioned emitter-follower transistors QS and Q6. When this output signal at the low level VL is to be produced, the output signal ot in the opposite phase is raised to the high level to turn ON the active pull-down N-channel type MOSFET MN. Therefore, the word lien W can be quickly extracted to the low level VL by the constant current Ief. Specifically, the access selecting transmission gate MOSFETs constructing the numerous memory cells MC are connected with the word lines W, and these word lines are quickly extracted to the low level by the constant current Ief which is produced when the active pull-down N-channel type MOSFET MN is turned ON.

The output signal having its level converted by the level converter of this embodiment has its high level VH determined by the following equation (2):

$$VH = -VBE(Q6) \qquad (2)$$

When the inverted output signal ob of the aforementioned current switch circuit is at the high level, the word line can be quickly raised from the aforementioned low level VL to the value of $-[VBE(Q5)+ VBE(Q6)]$ because the emitter-follower output transistors Q5 and Q6 are in the Darlington connection. In other words, the word line quickly rises such that the signal change of Ics×RC1 corresponds to the signal change of the differential switch circuit. At this time, the active pull-up P-channel MOSFET MP is turned ON in response to the low level of inverted output signal or. As a result, the base potential of the output transistor Q6 rises to the earth potential of the circuit so that the high level VH is finally raised to a level expressed by the equation (2), as described above. In other words, the active pull-up P-channel type MOSFET MP plays the role of compensating the level reduction of the base-emitter voltage VBE (QS) due to the emitter-follower transistor Q5.

Thus, the time period t for the word line W to be raised from the unselected low level to the selected high level is determined as the sum of: the time period t1 for the base potential of the transistor Q6 to be raised by the emitter-follower transistor Q5 from the low level of VL+VBE(Q6), as expressed by the aforementioned equation (1), by −VBE(Q5) to (Ics×RC1); the time period for the rise from this potential to the earth potential of 0 V by the active pull-up P-channel MOSFET MP; and the time period t3 for the output transistor QB to charge the word line W.

Here, since the P-channel type MOSFET MP has already started its conduction for the time period t1 in response to the low level of the noninverted output signal ot, the base potential of the transistor Q6 instantly rises to the earth potential of 0 V. Moreover, this transistor Q6 can rise the level of the word line W to the aforementioned high level VH so that the word line W may be charged by the current which is amplified at a current amplification factor from the base current fed by the P-Channel type MOSFET MP.

The absolute value of the amplitude of the output signal of the level converter in this embodiment is expressed by Ics×RC1+VBE(Q5). This signal amplitude is set to match the signal amplitude of the CMOS circuit such that the CMOS circuit has its high-level operating voltage set to the aforementioned high level VH and its low-level operating voltage set to the aforementioned low level VL. Specifically, the aforementioned negative supply voltage VEE is set to about −4 V, and the aforementioned signal amplitude is set to about 2.4 V. Here, the base-emitter voltage VBE of the transistor is ordinarily at about 0.8 V so that the value of Ics×RC1 is set to about 1.6 V. Therefore, in order that the differential transistors Q1 to Q3 constructing the current switch circuit may not operate in the saturated region, their input signals XD1 XD2 have their high levels suppressed to about −1.6 V.

At the ambient temperature of 25° C., the signal at the ECL level takes such a small amplitude as to have a high level of −1.105 to −0.810 V and a low level of −1.85 to −1.475 V. Therefore, the signals XD1 and XD2 at the ECL level to be inputted to the aforementioned current switch circuit are not inputted as they are at the aforementioned level but are suppressed to have their high level less than −1.6 V through a suitable level shift circuit such as the emitter-follower transistors. In response to this, the reference voltage VBB is set to such a voltage, e.g., about −2 V that the reference voltage at the ECL level has its level likewise shifted in a manner to correspond to the level shift of the aforementioned input signal. The input signals XD1 and XD2 to be fed to the bases of the input differential transistors Q1 and Q2 constructing the current switch circuit have their low level set to about −2.4 V. As a result, the shared emitters of the differential transistors have a potential of about −3.2 V so that a voltage sufficient for operating the transistors or MOSFETs constructing the constant current source can be retained even if the supply voltage VEE is at a relatively level such as −4 V, as described above.

In the circuit having a function as the word driver for the level conversion and for producing the word line selecting signal, the supply voltage VEE is nothing but a constant current through the constant current source so that it will not produce any noise. If, however, the aforementioned power supply noise is superposed in another adjoining circuit or the like, the noise amplified under the influence is superposed on the output. In order to stabilize the circuit operations, therefore, the MOSFETs MN1 to MN4 for producing the aforementioned constant current Ics or Ief have their gates fed with the constant voltage VIE through a resistor R52, and a capacitor C12 is connected between the gates and the supply voltage VEE acting as the source. The capacitor C12 may be constructed of the gate capacity of the MOSFET.

Figure 9:
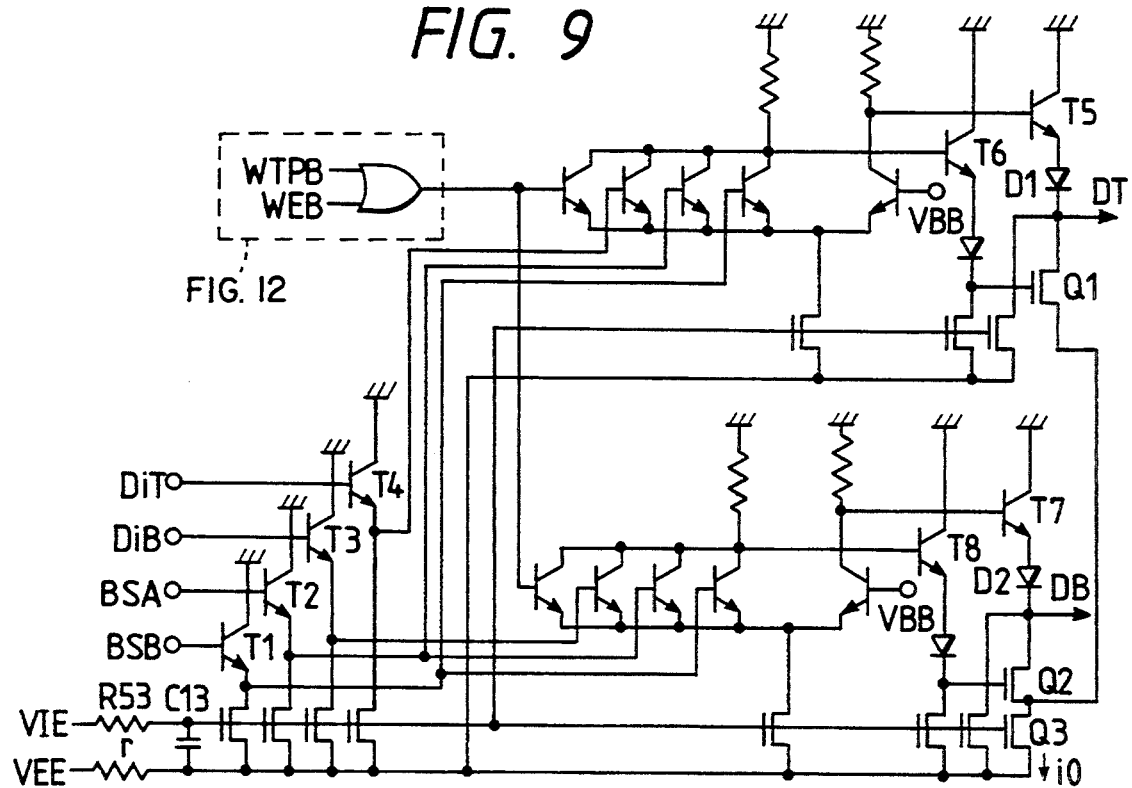
FIG. 9 is a circuit diagram showing one embodiment of a write circuit in the static RAM, to which is applied the present invention.

FIG. 9 is a circuit diagram showing one embodiment of a write circuit included in the input buffer I B of FIG. 7. In FIG. 9, only the circuit elements necessary for describing the present invention are designated at circuit symbols, but the circuit symbols of the circuit elements corresponding to the portions to be functionally described are omitted.

In response to a write pulse WTPB for determining the write time and a write enable signal WEB for instructing the writing operation, the OR gate activates the write circuit substantially. Specifically, another input is rendered effective for the ECL current switch circuit constructed of a differential transistor circuit, if both the write pulse WTPB and the write enable signal WEB are at the low level. The write pulse WTPB is produced in the internal circuit on the basis of a later-described clock pulse CLK, although not especially limited thereto, to determine the write time period for the memory cells. The write enable signal WEB is a control signal for instructing the writing operation if it is at the low level.

The constant current source composed of the transistors T1 to T4 and the MOSFETs connected with the emitters of the MOSFETs construct together the emitter-follower circuit for fetching next input signals necessary for the writing operation. Write data DiT and DiB are complementary write data. If the write data are at the low level of 0, the write data DiT is given the low level, and the write data DiB is given the high level. If the write data are at the high level of 1, the write data DiT are given the high level, and the write data DiB are given the low level. Signals BSA and BSB are block selecting signals for the case, in which the memory array is divided into a plurality of blocks, and are produced by decoding the block address. In case the memory array is constructed of only one block the signals BSA and BSB can be replaced by chip selecting signals CS or the like.

The aforementioned write data DiT are fed to the base of one input transistor of the upper current switch circuit, and the write data DiB are fed to the base of one input transistor of the lower current switch circuit. The upper circuit produces the write signal corresponding to the noninverted complementary data line DT selected in the memory array. The lower circuit produces the write signal corresponding to the inverted complementary data line DB selected in the memory array.

The signals BSA and BSB are individually fed to the bases of the input transistors of the upper and lower circuits.

In the ECL OR gate constructed of the aforementioned current switch circuit, if the writing operation is instructed so that the memory block assigned to the circuit is selected for a constant period corresponding to the write pulse, the write signal to be produced to the complementary data lines DT and DB, with which are connected the memory cell MC to be selected, is produced in response to the write input data. The complementary data lines DT and DB are given a relatively high parasitic capacity by connecting them with the numeral memory cells so that a relatively large signal amplitude corresponding to the aforementioned operating voltage VEM is required for the writing the selected memory cell. Therefore, the write signal is required to have a high drive current and a large signal amplitude.

In order to produce the aforementioned pair of complementary write signals, this embodiment uses a pair of output circuits composed of the emitter-follower output transistors and the active pull-down circuit. Specifically, in one output circuit corresponding to the noninverted complementary data line DT, the N-channel MOSFET Q1 is connected through the level shift diode D1 with the emitter-follower output transistor T5 which is made receptive of the OR output from the ECL circuit arranged at the upper side. The MOSFET Q1 has its gate fed with the NOR output from the ECL circuit through the emitter-follower output transistor T6 and the levee shift diode. The aforementioned emitter-follower output transistor T6 has its emitter equipped with the constant current source MOSFET as a load. The output transistor T5 has its emitter equipped with the constant current source MOSFET for feeding the bias current.

In the other output circuit corresponding to the inverted complementary data Line DB, the N-channel type MOSFET Q2 is connected through the level shift diode D1 with the emitter-follower output transistor T7 which is made receptive of the OR output from the ECL circuit arranged at the lower side. The MOSFET Q2 has its gate fed with the NOR output from the ECL circuit through the emitter-follower output transistor T8 and the level shift diode. The emitter-follower output transistor T8 is equipped with the constant current source MOSFET as a load. The output transistor T7 has its emitter equipped with the constant current source MOSFET for feeding the bias current.

In this embodiment, the MOSFETs Q1 and Q2 are turned ON only when the low-level output signal is to be produced. Therefore, by connecting the aforementioned constant current MOSFETs with the emitters of the output transistors T5 and T7, these transistors have their biases retained. Moreover, the write data are in complementary relation so that the MOSFETs Q1 and Q2 are turned ON only complementarily. Therefore, these MOSFETs Q1 and Q2 have their sources shared and connected with the constant current source MOSFETs to reduce the switch current io flowing through the supply voltage VEE at the time of the low-level output thereby to reduce the noise of the supply voltage VEE.

In case, however, the writing operation is carried out at the unit of as many bits as 16 bits, as has been described hereinbefore, the noises may be superposed one on the other to increase the noise on the supply voltage VEE. As a result, even in case the aforementioned counter-measures are carried out for reducing the noise, the individual constant current MOSFETs have their gales fed with the constant voltage VIE through a resistor R53, and a capacitor C13 is connected between the gates and sources (or VEE) of those MOSFETs. This makes it possible to effect stable operations with being influenced by neither the noise due to the switching current io of itself nor the noise to occur in another adjoining circuit. In this embodiment, too, the capacitor C13 may be constructed by making use of the gate capacity of the constant current MOSFETs.

Figure 10:
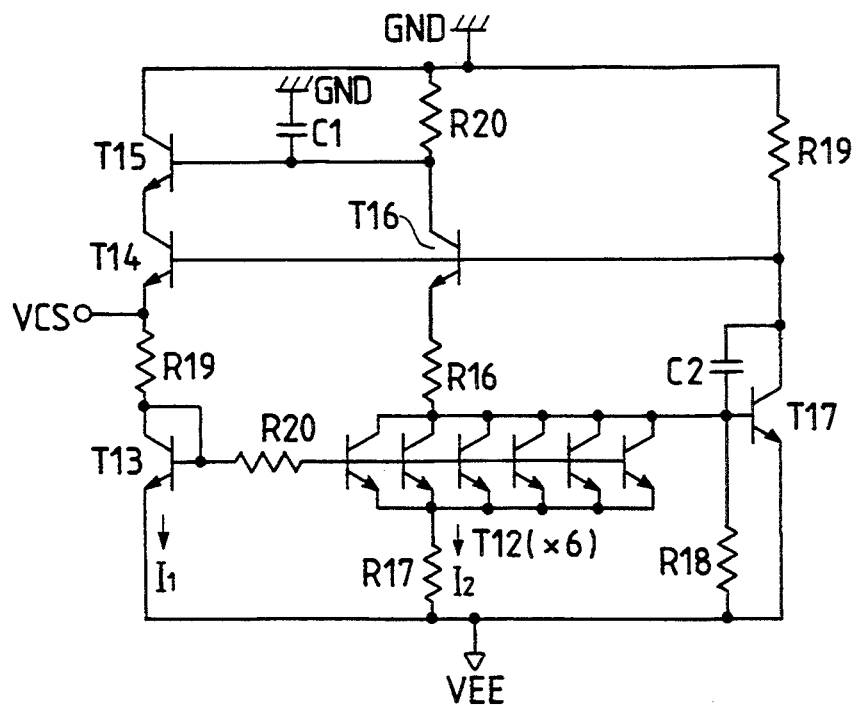
FIG. 10 is a circuit diagram showing one embodiment of a constant voltage generator used in the present invention.

FIG. 10 is a circuit diagram showing one embodiment of a constant voltage generator VCSG.

A transistor T17 has its emitter connected with the power supply terminal VEE. A resistor R18 is connected between the collector of the transistor T17 and the earth potential point of the circuit. An oscillation preventing capacitor C2 is connected between the base and collector of the transistor T17. This transistor T17 has its base-emitter voltage fed to the collector of a transistor T12. This transistor T12 is constructed either by connecting six transistors in parallel or by giving an emitter area corresponding to the six transistors.

The transistor T12 has its emitter connected through an emitter resistor R17 with the supply voltage VEE. The collector of the transistor T12 is connected through a resistor R16 with the emitter of a transistor T16. This transistor T16 has its base connected with the collector of the aforementioned transistor T17 and its collector connected through a resistor R20 with the earth potential GND of the circuit. The base of the aforementioned transistor T12 is connected through the base resistor R20 with the base and collector of a diode connection transistor T13. This transistor (or diode) T13 has its emitter (or cathode) connected with the supply voltage VEE and its base and collector (or anode) connected through a resistor R19 with the emitter of an emitter-follower output transistor T14. This output transistor T14 has its collector connected with the emitter of a transistor T15. This transistor T15 has its base connected with the collector of the aforementioned transistor T16. The collector of the transistor T15 is connected with the earth potential GND of the circuit. The collector of the transistor T16 is connected through the resistor R20 with the earth potential GND. The capacitor C1 is connected between the base of the transistor T15 and the earth potential GND.

The constant voltage circuit thus constructed produces and outputs the constant voltage VCS, which is given substantially neither any temperature dependency nor any power dependency, from the emitter of the aforementioned output transistor T14. If the current to flow through the transistor T12 is designated at $I_2$ whereas the current to flow through the transistor (or diode) T13 is designated at $I_1$, the aforementioned voltage VCS is determined from the following equation (3). Incidentally, the numerals attached to the base-emitter voltage VBE correspond to those attached to the individual transistors.

$$VCS = R19 \times I_2 + V_{BE13} \tag{3}$$

If the relation of $V_{BE16} = V_{BE14}$ is assumed, the aforementioned current $I_2$ is determined by the following equation (4):

$$I_2 = (V_{BE13} - V_{BE12}) \div R17 \tag{4}$$

If this equation (4) is substituted into the equation (3), the following equation (5) is determined:

$$VCS = R19\ [(V_{BE13} - V_{BE12}) + R17] + V_{BE13} \quad (5)$$

Since the equation (5) does not contain the supply voltage VEE, the voltage is stable against the fluctuation of the supply voltage VEE. Moreover, by setting the ratios properly between the resistors R16 and R17, and R17 and R19 at the righthand term, the temperature owned by the base-emitter voltage $V_{BE13}$ of the transistor T13 can be offset. These compensations of the power dependency and the temperature dependency are similar to those in the constant voltage circuit used in the ECL circuit of 100K type. The constant VCS is set to a level such as −2.88 V, although not especially limited thereto.

Figure 11:
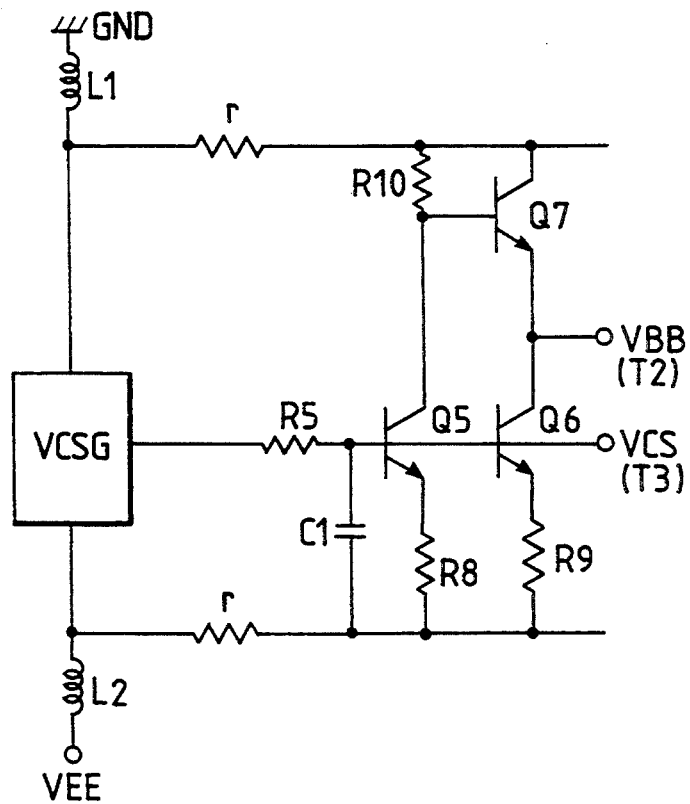
FIG. 11 is a circuit diagram showing one embodiment of a reference voltage generator used in a semiconductor integrated circuit device, to which is applied the present invention.

FIG. 11 is a circuit diagram showing one embodiment of the reference voltage generator.

The reference voltage generator of this embodiment produces the reference voltage VBB by making use of the output voltage VCS of the constant voltage generator VCSG. Specifically, the constant voltage VCS is fed to the base of the constant current transistor Q5, in which is produced a constant current set by the resistance of an emitter resistor R8. The transistor Q5 has its base fed with the constant voltage VCS through the resistor R5 constructing the time constant circuit, as described above, and the capacitor C1 constructing the time constant circuit is connected between the base and the supply voltage VEE of the circuit. These resistor R5 and capacitor C1 are given a large time constant as in the aforementioned embodiment of FIG. 1.

As a result, the switching current or the like flows into the supply line VEE equipped with the reference voltage generator so that the transistor Q5 passes a stable constant current even if the noise is caused in the supply voltage VEE by the distribution resistor Γ and the inductance component L2. This constant current flows through the resistor R10 to produce a constant voltage referring to the earth potential of the circuit. This constant voltage is fed to the base of the emitter-follower transistor Q7 so that the reference voltage VBB is outputted from the emitter of the transistor Q7. This voltage is fed to the base of the transistor T2, for example, in the circuit of FIG. 1. The transistor Q7 has its emitter equipped with the constant current transistor Q6 through which flows the constant current stabilized by the aforementioned time constant circuit. The aforementioned constant voltage VCS is fed to the base of the transistor T3, for example, in the circuit of FIG. 1.

Figure 12:
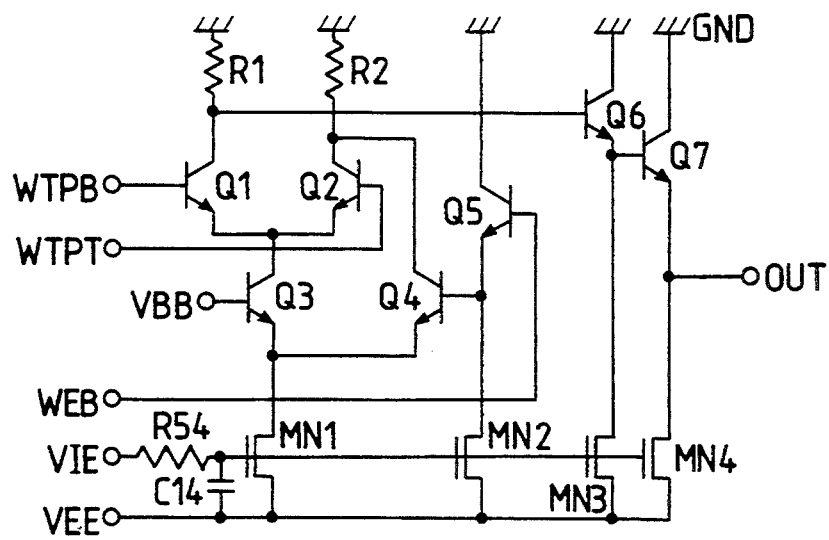
FIG. 12 is a circuit diagram showing one embodiment of an OR gate disposed in the write circuit of FIG. 9.

FIG. 12 is a circuit diagram showing one embodiment of the OR gate disposed in the aforementioned circuit of FIG. 9. The transistor Q4, which is differentially connected with the transistor Q3 having its base fed with the reference voltage VBB, has its base fed with the write enable signal WEB through the emitter-follower transistor QS. As a result, the differential transistors Q3 and Q4 perform their switching actions complementarily in response to the high/low levels of the write enable signal WEB.

The differential transistor Q3 has its collector equipped with the differential transistors Q1 and Q2 which are made receptive of the complementary write pulses WTPB and WTPT. These differential transistors Q1 and Q2 have their collectors connected with the load resistors R1 and R2. The collector output of the transistor Q1 is outputted as the aforementioned write pulses from an output terminal OUT through the emitter-follower transistors Q6 and Q7 having the Darlington connection. The output signal is fed to the base of one of the input transistors of the current switch circuits arranged in the upper and lower portions of FIG. 9.

When the write enable signal WEB instructs the low-level writing operation, as described above, the transistor Q3 is turned ON to feed the constant current to the differential transistors Q1 and Q2 so that the write pulses corresponding to the complementary write pulses WTPB and WTPT are outputted from the output terminal OUT. On the contrary, when the write enable signal WEB instructs the high-level reading operation, the transistor Q4 is turned ON, and the transistor Q3 is turned OFF. As a result, the output signal is set to the high fixed level independently of the write pulses WTPB and WTPT. Incidentally, the collector of the transistor Q4 is made common with the collector of the transistor Q2, although not especially limited thereto.

The MOSFETs MN1 to MN4 acting as the constant current source have their gates fed with the constant voltage VIE through a resistor R54 constructing the aforementioned time constant circuit, and a capacitor C14 constructing the time constant circuit is connected between the gates and the supply voltage VEE of the circuit. The resistor R54 and the capacitor C14 are given a large time constant like before. As a result, the switching noise on the supply voltage VEE is not superposed on the write pulse so that the writing operations are stably performed.

Figure 13:
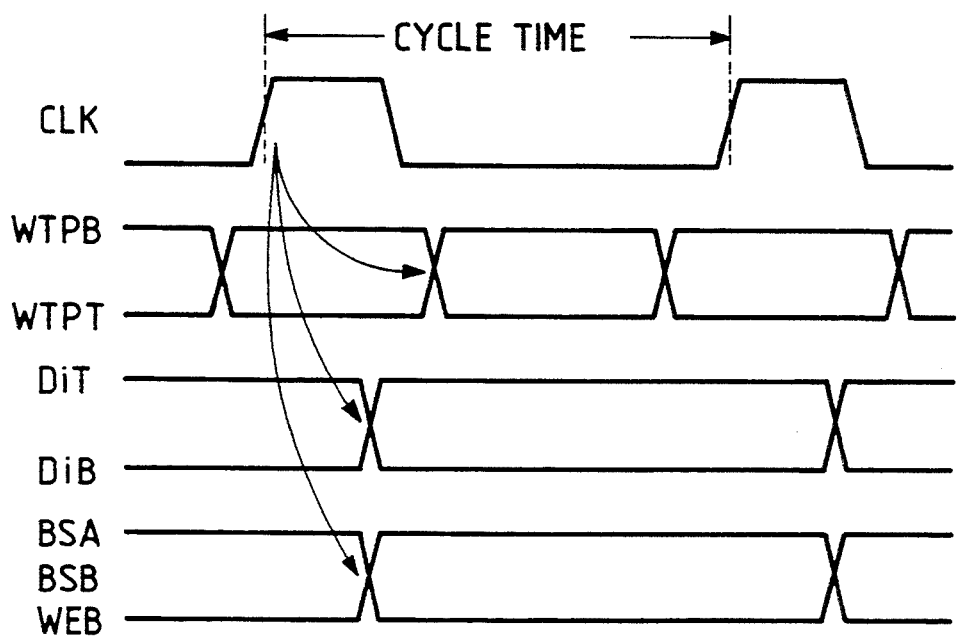
FIG. 13 is a timing chart showing one example of the writing operation of the static RAM, to which is applied the present invention.

FIG. 13 is a timing chart for explaining one example of the writing operation of the static RAM of the foregoing embodiments. With reference to the timing chart of FIG. 13, here will be described the operations of the write circuit shown in FIG. 9.

The write pulse is composed of the complementary signals WTPB and WTPT, although not especially limited thereto, and is produced in the RAM or in the semiconductor integrated circuit device having the RAM on the basis of the clock pulse CLK. FIG. 9 uses the complementary signal WTPB for raising the low level to the active level. The complementary write data DiT and DiB, the block select signals BSA and BSB and the write enable signal WEB are inputted into the aforementioned write circuit through the latch circuit, which is operated by the clock pulse CLK, by the logic circuit in the aforementioned RAM or of the semiconductor integrated circuit device having the RAM.

In synchronism with the rise of the clock pulse CLK, there are produced the aforementioned complementary write data bit and bib, the block select signals BSA and BSB and the write enable signal WEB. After the individual signals necessary for such writing operation have been fetched, the write pulses WTPB and WTPT are generated to write the selected memory cells. Specifically, in the write circuit of FIG. 9, while the write pulse WTPB is at the low level, the complementary data lines DT and DB selected according to the write data bit and bib are fed with the high/low level write signals. When tile aforementioned write signal WTPB is set to the high level, the writing operation is ended to raise both the output signals DT and DB of the write circuit to the high level.

This embodiment performs an access to the RAM in synchronism with the clock pulse CLK. Therefore, in the output circuit having the aforementioned active pull-down circuit as a load, the current flows to the side of the supply voltage VEE to generate the noise in the supply voltage line VEE. The period produced by the noise corresponds to the period of the aforementioned clock pulse CLK. Therefore, the time constant of the time constant circuit, which is constructed of the resistor and the capacitor in the constant current transistors or the MOSFETs, is set to a sufficiently large value for the period the aforementioned clock pulse CLK. Thanks to this time constant circuit, the potential of the base and emitter of the transistor or the gate and source of the MOSFET are retained by the time constant circuit, even if a noise occurs in the power supply line VEE, so that the noise is not superposed on the signal current. As a result, it is possible to retain a level margin having a small signal amplitude such as the ECL level.

Figure 14:
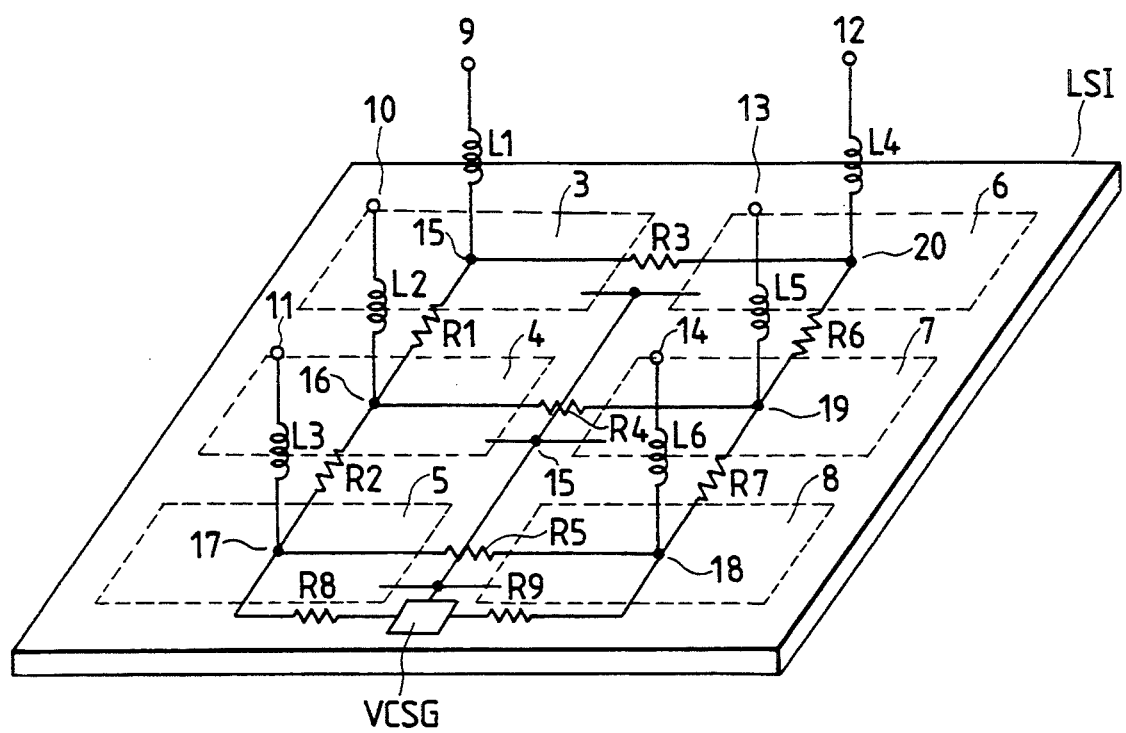
FIG. 14 is an in-chip layout diagram showing one embodiment of the semiconductor integrated circuit device according to the present invention.

FIG. 14 is an in-chip layout diagram showing one embodiment of the semiconductor integrated circuit device according to the present invention. In order to facilitate understanding of the invention, there are stereoscopically shown in FIG. 14 the distribution resistances or distribution inductance components, which are parasitically present in the internal power supply lines.

The semiconductor integrated circuit device LSI is given a plurality of functional blocks 3 to 8. In order to reduce the power supply impedance, the operating voltage is fed to those functional blocks 3 to 8 through a plurality of terminals 9 to 14 and is commonly connected through the internal power supply lines. The resistors R1 to R7 are the distribution resistors which are parasitically present in those power supply lines, and the inductance components L1 to L6 are those which are parasitically present in the leads or wires of the semiconductor integrated circuit.

The semiconductor integrated circuit device having such a large circuit scale is equipped with a constant voltage generator VCSG. This constant voltage generator VCSG feeds a relatively high DC current to produce the aforementioned constant voltage. In this embodiment, in order to reduce the power consumption of the semiconductor integrated circuit, only one circuit is packaged in the semiconductor integrated circuit device so that it may be commonly used in the constant current source of all the functional blocks 3 to 8, despite of the large circuit scale of the semiconductor integrated circuit.

The individual functional blocks are given different supply voltages VEE between themselves because they have unique switching current flows. With such potential changes, the constant voltage VCS is shared, as described above, such that the constant currents of the individual functional blocks change with the changes in the supply voltages VEE between the functional blocks. These functional blocks realize the systematic digital signal processing functions; by transferring the signals mutually. As a result, the potential change caused in response to the changes in the individual voltages VEE is superposed as the noise upon the signal level thereby to deteriorate the level margin of the signal transfer between the functional blocks.

In this embodiment, the constant current transistors or the constant current MOSFETs made receptive of the constant voltage VCS or the constant voltage VIE, as described above, are equipped with the time constant circuit composed of the resistor and the capacitor so that the constant current is produced without being influenced by the fluctuation of the operating voltage VEE in the individual functional blocks or units. As a result, the signal at a low level such as the ECL level can be stably transmitted.

The operational effects to be obtained from the foregoing embodiments are as follows:

(1) The output circuit is constructed of the emitter-follower transistors using as a load the active pull-down circuit which feeds the output current to the operation supply voltage in response to the output signal of the current switch circuit corresponding to the input signal. The constant voltage is transmitted through the resistance element to the constant current element for feeding the operating current of the current switch circuit. The time constant circuit is constructed by connecting the capacitor between the input of the constant current element and the operating supply voltage, such that its time constant is set to a longer value than the period of the output signal of the output circuit. The construction thus made can have advantages that a higher drive current and a larger signal amplitude can be achieved by the aforementioned output circuit, and that the constant voltage to be applied to the constant voltage element by the time constant circuit disposed at the input side of the constant current element is stabilized with respect to the noise component which is generated in the operating supply voltage by the current to flow through the output circuit, thereby to retain the level margin of the small amplitude signal to be produced by the current switch circuit.

(2) There is attained an effect that a high speed can be realized, because the load necessary for a relatively high drive current and a relatively large signal amplitude such as for the address selection of the memory cell composed of the CMOS circuit or for the write amplifier can be directly driven by the output of the ECL circuit.

Although our invention has been specifically described in connection with its embodiments, but it should not be limited to the foregoing embodiments but can naturally be modified in various manners without departing from the gist thereof. For example, the input signal may be a signal having not only the ECL level but also a similarly small amplitude. Therefore, the current switch circuit may be composed of not only the bipolar transistors but also the differential connection MOSFETs. The specific construction of the active pull-down circuit, which is disposed in the output circuit for producing the relatively large drive current and signal amplitude in response to the output signal having a small amplitude such as the ECL level, can take a variety of modes of embodiment.

The output circuit may be any if it is constructed such that the switch current may flow to the supply voltage so as to attain the large drive current and signal amplitude. The operating voltage may be either negative, as in the ECL circuit, or positive. The CMOS circuit may be constructed of the memory array, as described above, or a logical circuit such as a gate array. Moreover, the static RAM of the ECL interface may be packaged in the large-scale semiconductor integrated circuit, as described bore, or may construct one semiconductor memory device.

The present invention can be widely applied to a variety of semiconductor integrated circuits which are equipped with the output circuit capable of producing relatively large drive current and signal amplitude in response to the output signal having a small amplitude such as the ECL level.

The effects to be obtained by the representative of the invention disclosed herein will be briefly described in the following. Specifically, the output circuit is constructed of the emitter-follower transistors using as a load the active pull-down circuit which feeds the output current to the operation supply voltage in response to the output signal of the current switch circuit corresponding to the input signal. The constant voltage is transmitted through the resistance element to the constant current element for feeding the operating current of the current switch circuit. The time constant circuit is constructed by connecting the capacitor between the input of the constant current element and the operating supply voltage, such that its time constant is set to a longer value than the period of the output signal of the output circuit. Thus, a higher drive current and a larger signal amplitude can be achieved by the aforementioned output circuit. The constant voltage to be applied to the constant voltage element by the time constant circuit disposed at the input side of the constant current element is stabilized with respect to the noise component which is generated in the operating supply voltage by the current to flow through the output circuit, thereby to retain the level margin of the small amplitude signal to be produced by the current switch circuit.

What is claimed is:

1. A semiconductor integrated circuit device comprising:
   a first wiring line for a first supply voltage;
   a second wiring line for a second supply voltage;
   a current switch circuit, coupled to said first wiring line, receiving an input signal and providing an output in response to said input signal received;
   an output circuit, coupled between said first and second wiring lines, receiving said output of said current switch circuit and providing an output signal in accordance with the output of said current switch circuit, a current produced in response to a changing of said output signal of said output circuit being fed from said output circuit to said second wiring line;
   a current source element, coupled between the current switch circuit and said second wiring line, providing an operating current for said current switch circuit in accordance with application of a predetermined voltage at an input thereof;
   a voltage generator providing said predetermined voltage at an output thereof;
   a time constant circuit including (i) a resistor element, coupled between the output of said reference voltage generator and said input of said current source element, said predetermined voltage outputted by said voltage generator being fed to the input of said current source element via said resistor element, and (ii) a capacitor coupled between the input of said current source element and said second wiring line,
   wherein voltage noise provided on said second wiring line in response to current from said output circuit is transmitted to the input of said current source element via said time constant circuit such that a stable operation can thereby be maintained.

2. A semiconductor integrated circuit device according to claim 1, wherein said time constant circuit has a time constant set longer than a time period of the output signal of said output circuit.

3. A semiconductor integrated circuit device according to claim 1, wherein said current switch circuit includes an ECL circuit, and wherein said output circuit is an emitter-follower circuit having an active pull-down circuit as a load.

4. A semiconductor integrated circuit device according to claim 3,
   wherein said ECL circuit includes:
      a first bipolar transistor having a base coupled to receive said input signal, an emitter and a collector;
      a second bipolar transistor having a base coupled to receive a reference voltage, an emitter coupled to the emitter of said first bipolar transistor and to said current source element;
      a first resistive load element coupled between the collector of said first bipolar transistor and said first wiring line; and
      a second resistive load element coupled between said collector of said second bipolar transistor and said first wiring line, and
   wherein said emitter-follower circuit includes:
      a totem-pole arrangement of a third, pull-up transistor and a fourth, pull-down transistor operating as said load of said emitter-follower circuit, said third transistor having a control input coupled to a voltage division tapping node of said second resistive load, and said fourth transistor having a control input coupled to receive a downwardly level-shifted signal of the collector of said second bipolar transistor.

5. A semiconductor integrated circuit device according to claim 4, wherein the third and fourth transistors are bipolar transistors, respectively, the control input of each being the base thereof.

6. A semiconductor integrated circuit device according to claim 5, wherein said third transistor and said fourth transistor are an NPN type and a PNP type bipolar transistor, respectively.

7. A semiconductor integrated circuit device according to claim 6, wherein a level-shifting of the signal at the collector of said second bipolar transistor is effected through a fifth bipolar transistor having a base thereof connected to the collector of said second bipolar transistor and an emitter thereof connected via a level-shifted diode to the base of said fourth bipolar transistor and coupled, via a resistive element, to said second wiring line.

8. A semiconductor integrated circuit device according to claim 1, wherein said current switch circuit includes:
   a first bipolar transistor having a base coupled to receive said input signal, an emitter and a collector,
   a second bipolar transistor having a base coupled to receive a reference voltage, an emitter coupled to said emitter of said first bipolar transistor and a collector,
   a first load element coupled between said collector of said first bipolar transistor and said first wiring line, and
   a second load element coupled between said collector of said second bipolar transistor and said first wiring line.

9. A semiconductor integrated circuit device according to claim 8, wherein said current source element includes a third bipolar transistor having a base coupled to said resistor element and a collector-emitter path coupled between the commonly coupled emitters of said first, and second bipolar transistors of said current switch circuit and said second wiring line.

10. A semiconductor integrated circuit device according to claim 9, wherein said first to third bipolar transistors are of an NPN type.

11. A semiconductor integrated circuit device according to claim 8, wherein said current source element is an MOS transistor having a gate coupled to said resistor element and a drain-source path coupled between the commonly coupled emitters of said first and second bipolar transistors of said current switch circuit and said second wiring line.

12. A semiconductor integrated circuit device according to claim 11, wherein said first and second bipolar transistors are of an NPN type, and wherein said MOS transistor is of an N-channel conductivity type.

13. A semiconductor integrated circuit device according to claim 1, wherein said resistor element is a poly-silicon film resistor, and wherein said capacitor includes an insulating film as a dielectric material formed between a first and a second electrode thereof.

14. A semiconductor integrated circuit device according to claim 1, wherein said output circuit includes:
   an output terminal for providing said output signal thereof,
   a first transistor having a current path coupled between said first wiring line and said output terminal, and
   a second transistor having a current path coupled between said output terminal and said second wiring line, said first and second transistors being coupled to operate in a complementarily manner to each other in accordance with the output of said current switch circuit.

15. A semiconductor integrated circuit device according to claim 14, wherein the first and second transistors are bipolar transistors.

16. A semiconductor integrated circuit device according to claim 1, wherein said first supply voltage is reference ground and said second supply voltage is a negative voltage.

17. A semiconductor integrated circuit device comprising:
   a first wiring line for a first supply voltage;
   a second wiring line for a second supply voltage;
   a first circuit coupled between said first and second wiring lines and including an output circuit which feeds a current to said second wiring line in response to an operation thereof;
   a second circuit coupled between said first and second wiring lines and including:
   (i) a current switch circuit coupled to receive an input signal and providing an output in response thereto,
   (ii) a current source providing an operating current for said current switch circuit and having an input coupled to receive a predetermined voltage, and
   (iii) a second output circuit coupled to said current switch circuit and providing an output signal in accordance with the output of said current switch circuit;
   a voltage generator circuit having an output supplying said predetermined voltage;
   a resistor element coupled between the output of said voltage generator circuit and the input of said current source; and
   a capacitor element coupled between the input of said current source and said second wiring line,
   wherein voltage noise provided on said second wiring line in response to current from the output circuit in said first circuit is transmitted to the input of said current source in said second circuit in a manner whereby a stable operation can be maintained.

18. A semiconductor integrated circuit device according to claim 17, wherein said current switch circuit includes:
   a first bipolar transistor having a base coupled to receive said input signal, an emitter and a collector,
   a second bipolar transistor having a base coupled to receive a reference voltage, an emitter coupled to the emitter of said first bipolar transistor and a collector,
   a first load element coupled between the collector of said first bipolar transistor and said first wiring line, and
   a second load element coupled between said collector of said second bipolar transistor and said first wiring line.

19. A semiconductor integrated circuit device according to claim 18, wherein said current source element includes a third bipolar transistor having a base coupled to said resistor element and a collector-emitter path coupled between the commonly coupled emitters of said first and second bipolar transistors of said current switch circuit and said second wiring line.

20. A semiconductor integrated circuit device according to claim 19, wherein said first to third bipolar transistors are of an NPN type.

21. A semiconductor integrated circuit device according to claim 18, wherein said current source element includes an MOS transistor having a gate coupled to said resistor element and a drain-source path coupled between the commonly coupled emitters of said first and second bipolar transistors of said current switch circuit and said second wiring line.

22. A semiconductor integrated circuit device according to claim 21, wherein said first and second bipolar transistors are of an NPN type, and wherein said MOS transistor is of an N-channel conductivity type.

23. A semiconductor integrated circuit device according to claim 17, wherein said resistor element is a poly-silicon film resistor, and wherein said capacitor includes an insulating film as a dielectric material formed between a first and a second electrode thereof.

24. A semiconductor integrated circuit device according to claim 17, wherein said first supply voltage is reference ground and said second supply voltage is a negative voltage.

* * * * *